(12) United States Patent
Hasegawa et al.

(10) Patent No.: US 7,547,884 B2
(45) Date of Patent: *__Jun. 16, 2009__

(54) PATTERN DEFECT INSPECTION METHOD AND APPARATUS THEREOF

(75) Inventors: Masaki Hasegawa, Sayama (JP); Hiroshi Makino, Kokubunji (JP); Hikaru Koyama, Kodaira (JP); Zhaohui Cheng, Tokyo (JP); Hisaya Murakoshi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 487 days.

This patent is subject to a terminal disclaimer.

(21) Appl. No.: 11/449,650

(22) Filed: Jun. 9, 2006

(65) Prior Publication Data

US 2007/0085005 A1   Apr. 19, 2007

(30) Foreign Application Priority Data

Jun. 15, 2005   (JP)  .............................. 2005-174491

(51) Int. Cl.
*G01N 23/00* (2006.01)
*G21K 7/00* (2006.01)

(52) U.S. Cl. ........................ 250/310; 250/307; 250/306; 250/492.1; 250/311; 250/559.07; 250/492.2; 324/751; 324/756; 356/401; 356/237.5; 430/30

(58) Field of Classification Search ................. 250/310, 250/307, 306, 492.1, 311, 559.07, 492.2; 324/751, 756; 356/401, 237.5; 430/30
See application file for complete search history.

(56) References Cited

U.S. PATENT DOCUMENTS

| 5,502,306 | A | 3/1996 | Meisburger et al. |
| 5,576,833 | A | 11/1996 | Miyoshi et al. |
| 6,797,954 | B2 | 9/2004 | Shinada et al. |
| 7,288,948 | B2 * | 10/2007 | Hasegawa et al. ........... 324/751 |
| 2003/0127593 | A1 | 7/2003 | Shinada et al. |
| 2005/0190310 | A1 | 9/2005 | Koyama et al. |

FOREIGN PATENT DOCUMENTS

JP   2005-164451   12/2003

* cited by examiner

*Primary Examiner*—David A Vanore
*Assistant Examiner*—Meenakshi S Sahu
(74) *Attorney, Agent, or Firm*—Reed Smith LLP; Juan Carlos A. Marquez, Esq.

(57) ABSTRACT

In the present invention, the structure of an electrification control electrode is changed from a grid type to a slit type and thereby shadows are not formed when a wafer is irradiated with a beam. Further, a beam forming slit is disposed ahead of an electrification control slit, thus the electrification control slit is prevented from being irradiated with an electron beam for preliminary electrification, and thereby secondary electrons which disturb the control of the electrification are inhibited from being generated. The shape of the slit is designed so that the strength of an electron beam may gradually decrease toward both the ends of an electron beam irradiation region in the longitudinal direction thereof. Furthermore, a preliminary static eliminator to remove or reduce the unevenness in an electrification potential distribution which has undesirably been formed earlier is disposed.

23 Claims, 15 Drawing Sheets

PATTERN DEFECT INSPECTION METHOD AND APPARATUS THEREOF

CLAIM OF PRIORITY

The present application claims priority from Japanese application JP 2005-174491 filed on Jun. 15, 2005, the content of which is hereby incorporated by reference into this application.

FIELD OF THE INVENTION

The present invention relates to a method for inspecting electrical defects of a fine circuit formed on a semiconductor wafer and an apparatus thereof.

BACKGROUND OF THE INVENTION

As a method of detecting the defects of a circuit pattern formed on a wafer by comparative inspection of an image in a production process of a semiconductor device, JP-A No. 258703/1993, for example, describes a method of comparatively inspecting a pattern by a so-called SEM method wherein an electron beam focused into a spot is used for scanning. The feature of a SEM inspection apparatus is that the resolution thereof is higher than that of an optical inspection apparatus and it can detect electrical defects. However, since a SEM inspection apparatus is based on a method of focusing an electron beam into a spot and obtaining an image by two-dimensionally scanning the surface of a specimen, when a specimen is inspected with the apparatus, long scanning time is required and thus the apparatus has an essential drawback to the future increase of inspection speed.

Further, as an electron beam inspection method attempting to obtain a higher speed, JP-A No. 249393/1995, for example, describes an inspection apparatus of a projection type wherein a semiconductor wafer is irradiated with a rectangular electron beam and generated reflection electrons and secondary electrons are focused into an image with an electron lens. A projection type inspection apparatus can be expected to form an image at a higher speed than the SEM method since it can irradiate an object at a time with an electron beam of a higher current than the SEM method and can obtain an image in an integrated manner.

However, in the case of a projection type inspection apparatus, a problem is that the distribution of the emission angle of secondary electrons is wide at the time of imaging. The distribution of the emission angle of secondary electrons follows the cosine rule and hence most of the secondary electrons are emitted at a large angle on the basis of the direction of the normal to a wafer. When all of such secondary electrons are taken into an objective lens and focused into an image, a sufficient spatial resolution cannot be obtained due to the aberration of the objective lens. In order to obtain a sufficient spatial resolution of a 100 nm level, it is necessary to form an image while the secondary electrons used are limited to those emitted at angles within a small angle of aperture (0.1 rad for example) to the axial direction of a lens. Therefore, even though a high current electron beam is used for irradiation as an areal beam in order to form an image, the proportion of the secondary electrons capable of actually contributing to the imaging is low and hence a required S/N ratio of an image is hardly obtained. In the case of using reflection electrons too, the obtained emission amount is smaller by double digit in comparison with the electric current of the irradiation beam and it is difficult to obtain both high defect detection sensitivity and high speed inspection simultaneously with a conventional projection type inspection apparatus.

In the meantime, as a method of securing both high sensitivity defect detection and high speed detection, JP-A No. 108864/1999 discloses a projection type wafer inspection apparatus wherein electrons pulled back before they impinge with a specimen by field reversing immediately above a wafer (hereunder referred to as mirror electrons or mirror reflection electrons) are used as imaging electrons.

A mirror electron imaging type inspection apparatus has two main features which are different from the features of a conventional projection type inspection apparatus wherein secondary electrons and reflection electrons are focused into an image. The first feature thereof is that mirror electrons from a specimen do not have such a wide angle distribution as secondary electrons have and are emitted nearly straight above the surface of a specimen, and hence it is possible to take almost all of the electrons into an imaging lens system and increase the amount of image signals. The second feature thereof is that, in a region where incoming electrons are mirror-reflected immediately above a specimen, the kinetic energy of the electrons reduces considerably and the track changes in accordance with even a slight deviation of a surface, and hence the difference in image contrast between defective portions and normal portions increases. It means that the load for image processing reduces to the extent that the difference in image contrast between defective portions and normal portions increases in comparison with a secondary electron and reflection electron imaging type inspection apparatus that obtains an image of a high resolution and detects slight difference of the image. In addition to those features, in a mirror electron imaging type inspection apparatus, most of the irradiation electrons are reflected immediately above a wafer and hence basically they do not enter into the wafer. Electrons having slightly higher energy exist in an electron beam since the electron beam has an energy distribution and those electrons enter passing through a potential barrier. However, the value is several eV at most. That is, a mirror electron imaging type inspection apparatus can deal with even a specimen which has the fear of damage caused by an electron beam with a SEM inspection apparatus or a secondary electron imaging type inspection apparatus as an object of the inspection.

A mirror electron imaging type inspection apparatus sensitively detects potential change formed by the unevenness of a surface and can have good sensitivity also to electrical defects formed on a wafer in the same way as a SEM inspection apparatus. For example, when a defect of no electrical-conductivity exists, since the portion is electrically insulated, the electric potential on the surface of the portion can be differentiated from that of an electrically conductive normal portion by electrification, and the abnormality of the potential can be detected by using mirror electron imaging. However, in a mirror electron imaging type inspection apparatus, an irradiation electron beam is mostly repulsed immediately in front of a wafer by field reversing and hence it is impossible to control the electrification of a specimen with the irradiation electron beam. As a consequence, it becomes necessary to control the state of the electrification of the surface of a specimen before the irradiation of a primary electron beam (preliminary electrification) in order to obtain a stable inspection image. The preliminary electrification can be carried out by: a method of irradiating a specimen to be inspected with light including ultraviolet rays or an electron beam having energy enough to generate secondary electrons; a method of applying a prescribed potential to the surface of a specimen; or another method.

JP-A No. 14485/2004 describes a preliminary electrifier to electrify a wafer before inspection. The electrification potential formed on the surface of a wafer by applying preliminary electrification varies in accordance with the type of an insulator and a circuit pattern and, since electric charge escapes little by little, electrification potential decreases at a certain time constant. Such a time constant is sufficiently long in comparison with the time required for obtaining a mirror electron image but is insufficient in comparison with the inspection time of a whole wafer, and thus additional preliminary electrification is required during inspection.

In order to detect electrical defects and therefor control the electrification potential of a wafer by the preliminary irradiation of an electron beam, a control electrode is disposed immediately above the wafer. The control electrode in the case of JP-A No. 14485/2004 is configured so as to transmit an irradiation electron beam and apply electric potential immediately onto the wafer by using a grid-shaped electrode. The principle of the control of the electrification potential by a grid electrode is explained hereunder. When preliminary irradiation is applied, the value of the irradiation energy of an electron beam is set beforehand so that the secondary electron emission efficiency may be one or more. In the case of a general insulative film material for a semiconductor device, the value is about 500 V. The surface of an insulative film formed on a wafer is positively electrified gradually by the irradiation of an electron beam since the secondary electron emission efficiency thereof is larger than one. When a potential relatively positive to the potential of a wafer surface is applied to a control electrode, the generated secondary electrons are pulled toward the control electrode and hence the wafer surface is positively electrified gradually. When the electrification potential of the wafer surface equals to the potential of the control electrode, then the electric potential gradient between the control electrode and the wafer surface is leveled and hence the generated secondary electrons begin to return to the wafer surface. As a result, the positive electrification of the wafer surface is alleviated, the electric potential gradient between the control grid and the wafer surface reappears, and the secondary electrons are pulled toward the control electrode again. As a consequence, the electrification potential of the wafer surface balances with the potential of the control electrode at a nearly equal potential level.

When a potential relatively negative to the potential of a wafer surface is applied to a control electrode inversely, the generated secondary electrons are pushed back from the control electrode and return to the wafer surface and hence the effective secondary electron emission efficiency becomes lower than one. In consequence, the wafer surface is negatively electrified until the electric potential gradient between the control electrode and the wafer surface is leveled. By so doing, the electrification potential of a wafer surface is controlled with a control electrode.

When it is attempted to further increase inspection speed and improve defect detection accuracy in the inspection of a wafer pattern, conventional technologies have had the following problems.

In the case of a mirror electron imaging type inspection apparatus, when electrical defects in a wafer are electrified by preliminary irradiation, it is necessary that the electrification potential is uniform in the entire preliminary irradiation region. The reason is that, in a mirror electron imaging type inspection apparatus, since an image is formed by using the reflection of irradiation electrons at a certain potential plane of a wafer surface, if the electrification potential of the wafer varies even slightly, the distance between the potential plane at which the irradiation electron beam is reflected and the wafer surface also varies and, as a result, the imaging conditions vary and the contrast of the mirror electron image also varies. As a result of the present inventors' experiments, it has been found that the allowable variation of the electrification potential is about 0.5 V or less and such a uniform electrification potential distribution cannot be attained only by simply disposing a grid electrode and applying electron beam irradiation.

Further, there are some cases where a preliminary electrifier is applied also to a conventional SEM inspection apparatus. However, in the case of a SEM inspection apparatus, secondary electrons generated when irradiation electrons enter a wafer during inspection electrify the irradiation region again and the detection efficiency of the secondary electrons does not vary with the variation of specimen potential being about several volts, and hence the highly accurate uniformity by the preliminary electrification is scarcely required. Here, in the case of a mirror electron imaging type inspection apparatus, most part of the irradiation electron beam is repulsed immediately in front of a wafer by field reversing and hence it is impossible to control the electrification of a specimen with the irradiation electron beam.

Furthermore, in the case of the mirror electron imaging method, the required uniformity of the electrification of a specimen surface is as strict as in the range of about plus or minus 0.5 V and sufficient uniformity has not been obtained with a conventional preliminary electrification technology used for a SEM method. When a conventional preliminary electrification technology is applied to a mirror electron imaging type inspection apparatus, concretely it is estimated that the following problems arise.

In an electrification controller, a problem is that a grid electrode is used as the control electrode and the distribution of electrification potential becomes two-dimensionally uneven. In the case of applying electrification control by the irradiation of ultraviolet rays or an electron beam through a grid-shaped electrode, the irradiation is not applied to the portions of a wafer corresponding to the grid, and hence the supply of electric charge is insufficient and the portions where an intended electrification potential is not attained are undesirably formed. Electrification control by preliminary irradiation can be carried out at any time including before or during the inspection of a specimen to be inspected, but it goes without saying that such unevenness of electrification badly affects the inspection accuracy.

When preliminary irradiation is applied during inspection with a preliminary electrifier or the like, the unevenness of electrification increases particularly in the direction perpendicular to the wafer moving direction. A wafer moves relatively to a preliminary electrifier and the irradiation regions partially overlap with each other in the wafer moving direction in many cases. Therefore, the electrification state is equalized in the direction parallel with the moving direction and the unevenness is alleviated to some extent. However, with regard to the unevenness in the direction perpendicular to the moving direction, such equalization is not applied and hence the unevenness in electrification potential still remains. As stated above, a problem has been that an abnormal contrast caused by the unevenness of electrification potential in a mirror electron image is falsely counted as a defect in real inspection and correct inspection is hindered.

SUMMARY OF THE INVENTION

The present invention is characterized by adopting a means of always uniformly electrifying a desired region including the inspection region of a specimen before obtaining an inspection image by mirror electrons.

More specifically for example, the present invention is configured so that the electrification potential of a specimen may be equalized along with the movement of a stage by: disposing preliminary electrifiers onto a mirror electron imaging type inspection apparatus; then disposing not a grid-shaped electrode but an electrode having a slit-shaped opening as an electrode to control the electrification potential of each preliminary electrifier; and directing the longitudinal direction of the opening to the direction perpendicular to the moving direction of the stage. Further, the present invention is configured so that: the potential gradient at the boundary of the preliminary electrification region may be reduced by decreasing the irradiation strength as the measurement point comes close to the boundary of the preliminary electrification region; and thus sufficient equalization may be obtained by additional preliminary electrification.

The present invention makes it possible to: form always uniform electrification potential on a wafer; and thereby detect defects of a semiconductor pattern without error at a high speed.

DETAILED DESCRIPTION OF THE PREFERRED EMBODIMENTS

Configurations of examples according to the present invention are hereunder explained in reference to drawings.

Embodiment 1

Figure 1:
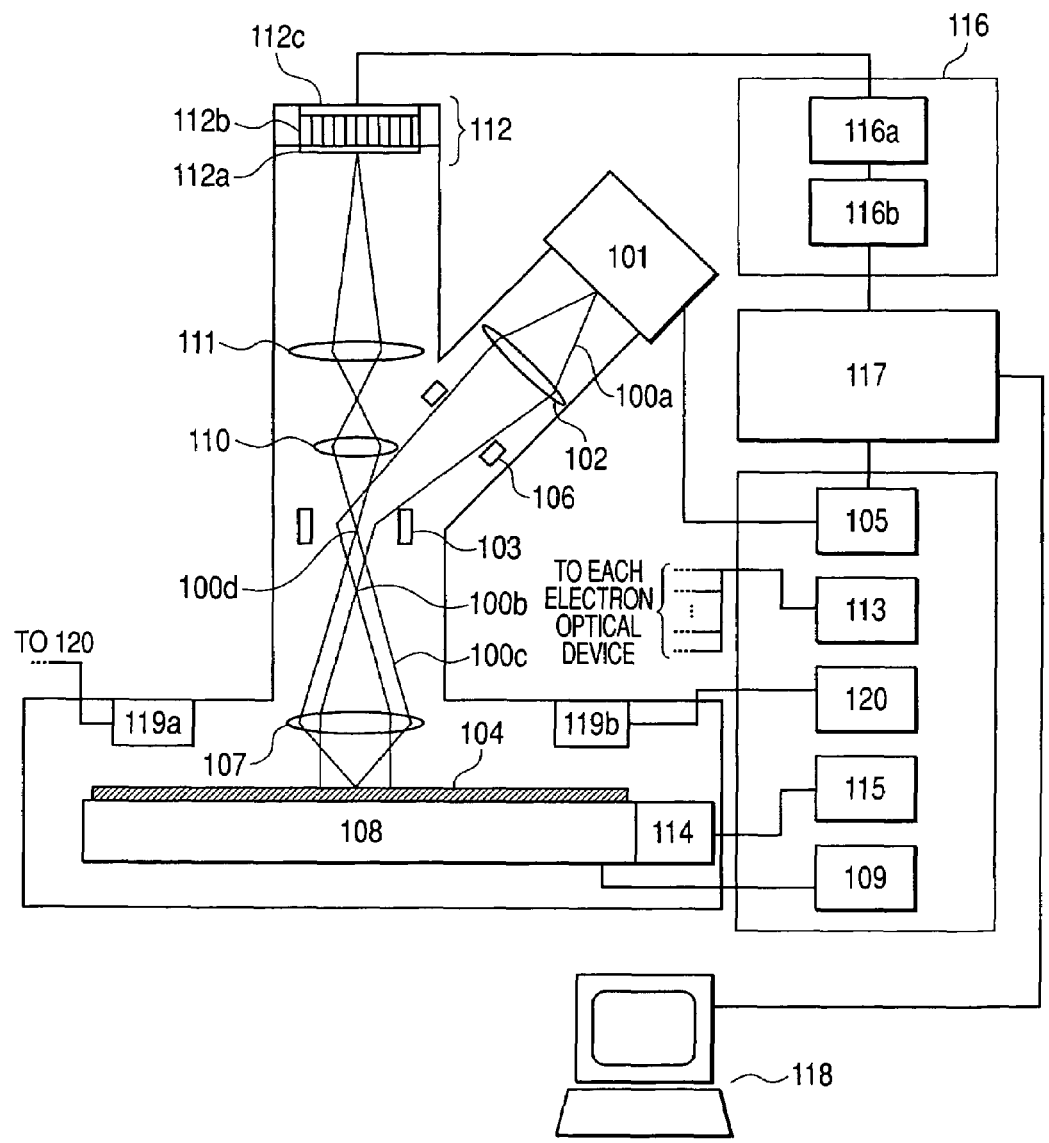
FIG. 1 explains the basic configuration of a mirror electron imaging type inspection apparatus according to the present invention.

FIG. 1 shows the outline of a mirror electron imaging type inspection apparatus on which preliminary electrifiers are mounted. Note that a vacuum pump for evacuation, a controller thereof, exhaust pipes, and others are not shown in the figure.

Firstly, major elements of an electron optical system of the present apparatus are explained. An irradiation electron beam $100a$ emitted from an electron gun 101: is deflected with an ExB deflector 103 while being converged with a condenser lens 102; forms a crossover $100b$; and thereafter is emitted in the form of nearly parallel rays onto a specimen wafer 104. Although the condenser lens 102 is expressed as single lens in the figure, it may also be a system combining plural lenses in order to optimize the optical conditions. In the present embodiment, a Schottky electron source of a Zr—O—W type is used as the electron gun 101. An electron gun using a Zr—O—W type Schottky electron source is suitable for the present apparatus which is aimed at high speed inspection since it can stably supply a uniform electron beam having a large electric current (1.5 μA for example) and an energy width of 1.5 eV or less. In the present invention however, the electron source is not limited to a Zr—O—W type electron source and any electron source is useful as long as it is an electron source which is small in size and has high luminance, and thus an electron source which uses carbon nanotubes or the like can also be used for example. The voltage and current necessary for operation such as extraction voltage to the electron gun 101, acceleration voltage to the extracted electron beam, heating current to an electron source filament, and others are supplied and controlled with an electron gun controller 105.

The ExB deflector 103 is placed in the vicinity of an imaging plane $100d$ on which an imaging electron beam $100c$ is focused. In this case, the aberration of the irradiation electron beam $10a$ is generated by the ExB deflector 103. When the correction of the aberration is required, another ExB deflector 106 for aberration correction is placed between the irradiation condenser lens 102 and the ExB deflector 103.

The irradiation electron beam $100a$ deflected by the ExB deflector 103 so as to be parallel with the axis perpendicular to the wafer 104 is formed with an objective lens 107 into an areal electron beam entering in the direction perpendicular to the surface of the specimen wafer 104. A fine crossover is formed on the focal plane of the objective lens 107 with the irradiation condenser lens 102 and hence it is possible to irradiate the specimen wafer 104 with an electron beam having good parallelism. The region of the specimen wafer 104 which is irradiated with the irradiation electron beam $100a$ is set so as to have a large area; for example, 2,500 μm² or 10,000 μm².

A negative voltage nearly equal to or slightly lower than (larger than in absolute value) the acceleration voltage of an electron beam is applied to the specimen wafer 104 mounted on a wafer stage 108. By this negative voltage, the irradiation electron beam $100a$: scarcely impinges with the wafer 104; is decelerated short of the wafer and reflected; and is pulled back upward as mirror electrons. The supply and control of the voltage applied to the wafer 104 are carried out with a wafer voltage controller 109. It is necessary to adjust the difference from the acceleration voltage of the irradiation electron beam 100a with a high degree of accuracy in order to reflect the irradiation electrons in the very vicinity of the wafer, and thus the control is carried out in conjunction with the electron gun controller 105.

The electrons coming flying from the side of the wafer: reflect information related to the electrical defects of a circuit pattern on the wafer 104; and are taken into the apparatus as an image for the defect judgment by imaging using an electron imaging optical system. The mirror electrons: are subjected to focusing effect with the objective lens 107; move upward as they are in the vertical direction since the ExB deflector 103 is controlled so as not to apply deflection effect to the electron beam coming from the lower side; and are projected onto an image detector 112 in an expanded manner with an intermediate lens 110 and a projector lens 111. The projector lens 111 is described as single lens in the figure, but it may be composed of plural electron lenses for the purpose of securing a high magnification and correcting image distortion. The image detector 112 transforms an image into electric signals and sends the distribution of local electrification potentials on the surface of the wafer 104, namely a defect image, to an image processor 116.

In the electron optical system, in addition to the units explained here, auxiliary electron optical devices such as an aligner to correctly transfer an electron beam to each electron optical device, a stigma to correct the distortion of an image, and others are disposed in an appropriate manner. However, those are omitted in the figure. The control of an electron optical system including such auxiliary electron optical devices is implemented with an electron optical system controller 113.

Next, the image detector 112 is explained. The detection of an image is carried out by optically coupling a fluorescent screen 112a to transform a mirror electron image into an optical image with an optical image detector 112c through an optical image transfer system 112b. In the present embodiment, an optical fiber bundle is used as the optical image transfer system 112b. The optical fiber bundle is formed by bundling fine optical fiber elements of the same number as the number of pixels and can efficiently transfer an optical image. Further, when a fluorescent image having a sufficient amount of light is obtained, the optical transfer efficiency may be lowered, and thus it is also possible to: use an optical lens in replace of the optical fiber bundle; and focus an optical image on the fluorescent screen 112a onto the light receiving surface of the optical image detection element 112c with the optical lens. In this case, the flexibility of the optical transfer system increases and image processing such as the expansion and distortion correction of an optical image and the like can be carried out more easily. Furthermore, it is also acceptable to: insert an amplifier into the optical image transfer system; and make it possible to transfer an optical image having a sufficient amount of light to the optical image detector 112c. The optical image detector 112c transforms an optical image focused on the light receiving surface into electrical image signals and outputs the signals. As the optical image detector 112c, a CCD, an MCP (micro channel plate), a photodiode, or the like can be used. Otherwise, a TDI sensor using a time accumulation type CCD may be used.

The wafer stage 108 must be driven in synchronization with the timing of image capture at the image detector 112. In the case where a TDI sensor is used as the optical image detector 112c in particular, the image resolution considerably lowers unless the transfer of image signals among pixels is correctly synchronized with the movement of the wafer stage 108. For that reason, the wafer stage is equipped with a position sensor 114 to detect the position of the wafer stage, the drive of the stage is controlled with a stage controller 115, and the timing of image capture is transmitted to the image detector 112 on the basis of the information on the stage position coming from the position sensor 114.

The image processor 116 comprises an image signal storing unit 116a and a defect judgment unit 116b. The image signal storing unit 116a: obtains electron optical conditions, image data, and stage position data from the electron optical system controller 113, the image detector 112, and the stage controller 115, respectively; and stores image data in the manner of being liked to a coordinate system on the specimen wafer. The defect judgment unit 116b: uses the image data linked to the coordinate on the wafer; and judges a defect by various defect judging methods of comparing the image data with a prescribed value, an adjacent pattern image, an image at the same pattern position in an adjacent die, and the like. The coordinate of a defect and the signal strength of corresponding pixels are transferred to and stored in an inspection apparatus controller 117. Such a defect judging method is: either set by a user or coordinated with the type of a wafer beforehand; and selected by the inspection apparatus controller 117.

Operation conditions of each section of the apparatus are input from the inspection apparatus controller 117. Into the inspection apparatus controller 117, various conditions such as an acceleration voltage at the time of electron beam generation, an electron beam deflection width and deflection speed, a wafer stage traveling speed, the timing of image signal capture from image detection elements, and others are input beforehand. Then the inspection apparatus controller 117 controls the controllers of various elements in an integrated manner and acts as an interface with a user. The inspection apparatus controller 117 may also comprise plural computers which share the roles and are connected through communication circuits. Further, a monitor-mounted I/O device 118 is installed.

With the mirror electron imaging type inspection apparatus of the present embodiment, a specimen wafer is electrified insufficiently since the electron beam scarcely impinges with the wafer 104. However, it is necessary to sufficiently electrify a specimen wafer to the extent of creating a difference from normal portions in order to detect an electrical defect. For that reason, preliminary electrifiers 119 are provided.

Figure 2:
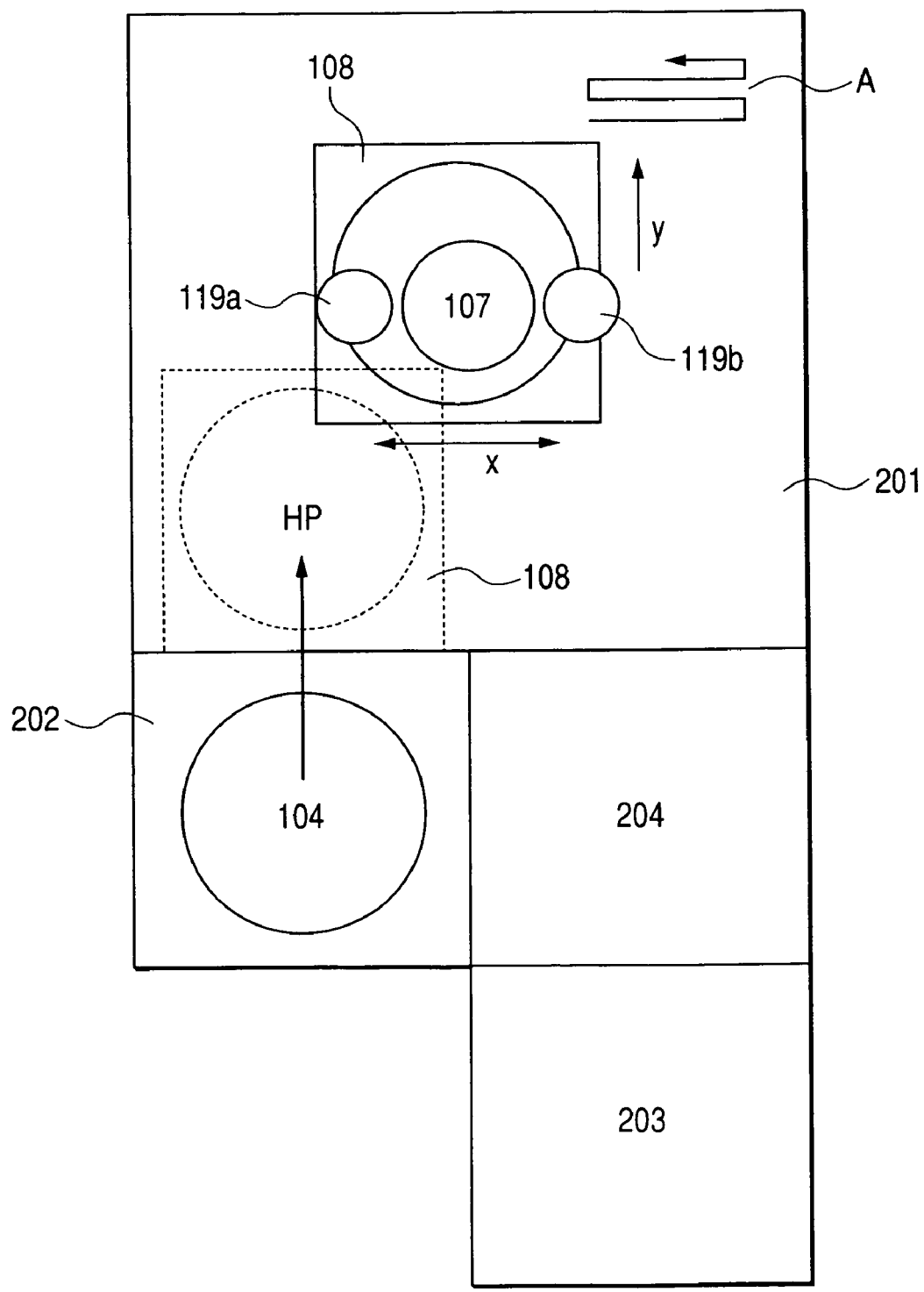
FIG. 2 explains the inspection operation of a mirror electron imaging type inspection apparatus.

Both preliminary electrifiers 119a and 119b are controlled with a preliminary electrification controller 120. The preliminary electrification controller 120, in conjunction with the wafer voltage controller 109 and the electron gun controller 105, controls the electrification potential on a wafer formed with the preliminary electrifiers 119a and 119b so as not to disturb the state wherein an irradiation electron beam is reflected in the very vicinity of a wafer surface. The details of the operations are explained with FIG. 2. In FIG. 2, an evacuating system to keep the apparatus in the state of vacuum, an image processing system, a stage control system, an electron optical system, a control system, and others are not shown. FIG. 2 is a view of a mirror electron imaging type inspection apparatus viewed from above. In FIG. 2, the details of an electron optical system column are omitted and only the position of an objective lens 107 for mirror electron imaging is shown. A wafer stage 108 held in a vacuum chamber 201 moves little by little in the Y direction while moving reciprocally in the X direction as shown with the arrows in the figure so as to be able to inspect the entire wafer. Each of preliminary electrifiers 119a and 119b is allocated on each side of the objective lens 107. The object thereof is: to efficiently apply preliminary electrification to a wafer moving reciprocally to the column immediately before inspection; and also to electrify the wafer before the inspection and eliminate the electrification after the inspection. The control system and electric wiring of the preliminary electrifiers 119a and 119b are omitted in the figure.

The wafer 104 to be inspected is firstly contained in a wafer cassette or the like and set at a wafer charging port 203. Thereafter the wafer is transferred into a preliminary chamber 202 open to the air with a transfer robot 204. Successively a charging port of the preliminary chamber 202 is closed, thereafter the preliminary chamber 202 is evacuated to form a vacuum with a vacuum pump, and the wafer 104 is transferred into the specimen chamber 201 which is always maintained in the state of vacuum without deteriorating the vacuum in the specimen chamber 201. When the wafer is transferred, the wafer stage 108 moves to the position shown by the reference character HP in the figure and receives the wafer. After the wafer is transferred into the specimen chamber 201, a gate to and from the preliminary chamber 202 is closed.

When a TDI sensor is used for the optical image detector 112c, the direction of integrating pixel signals conforms to the direction of continuous movement of the wafer stage 108. Further it is also necessary for the preliminary electrifier to be located in parallel with the direction of the continuous movement of the wafer stage when preliminary electrification is applied during inspection. In the inspection of a wafer, there are some cases where the direction of the continuous movement of the stage is rotated by 90 degrees in accordance with the arrangement of the pattern of the wafer to be inspected. That is, although, when a pattern to be inspected is arranged densely in the X direction in the figure and sparsely in the Y direction therein, the stage movement shown by the arrow A in the figure is desirable, when a pattern is arranged in the opposite manner, it is desirable to rotate the directions by 90 degrees. However, the attaching angle of the TDI sensor is constant usually, namely the integral direction of pixel signals is the X direction in the case of FIG. 2, the preliminary electrifiers 119 are also arranged in the X direction, and, if nothing is done, it is impossible to rotate the movement direction for inspection by 90 degrees as stated above. Therefore, the transfer robot 204 is provided with mechanism wherein the wafer set at the wafer charging port 203 is rotated in the movement direction for inspection assigned by a user when the wafer is transferred to the preliminary chamber 202, and the wafer is placed on the wafer stage of the preliminary chamber 202. In addition to the mechanism, it is also possible to: dispose two types of wafer charging ports 203; and use a type thereof when the inspection movement shown by the arrow A is underway and the other type thereof when the inspection movement in the direction rotated by 90 degrees is underway. Otherwise, although the transfer robot 204 transports a wafer to the preliminary chamber 202 while the direction of the wafer is always the same, it is also possible to: rotate the wafer stage of the preliminary chamber 202 in conformity with the inspection movement assigned by a user after the wafer is transported; and then transfer the wafer to the vacuum chamber 201 so as not to create contradiction between the direction of the wafer setting and the direction of the continuous movement of the wafer stage. Still otherwise, it is also possible to: add a wafer rotating mechanism to the wafer stage 108 itself; and satisfy the relationship predetermined by a user between the direction of the wafer setting and the direction of the continuous movement of the wafer stage in the vacuum chamber 201.

The inspection operations after the placement of a wafer is finished are explained taking the case where the inspection is carried out from the right upper portion of the wafer in FIG. 2 as an example. Firstly, the wafer stage 108 moves to the position where the first inspection region is located on the left side of the preliminary electrifier 119a. When the inspection starts, the wafer stage 108 moves toward the right side, the preliminary electrifier 119a carries out preliminary irradiation under predetermined conditions, and thus the wafer is electrified sequentially. When the wafer passes through the objective lens 107, a mirror electron image is obtained and a defect is detected from the inspection image. Thereafter, electrification is applied again if necessary when the wafer passes through under the preliminary electrifier 119b. The additional electrification includes the elimination of the electrification when the electrification potential is set at 0 V. After the inspection region passes through the preliminary electrifier 119b, the wafer slightly moves upward in the figure by a distance predetermined in the Y direction, and moves to the reverse side in the X direction. Since the direction of the wafer movement is reversed, in this scanning, the preliminary electrifier 119b electrifies the wafer up to an electrification potential required for the acquisition of a mirror electron image and the preliminary electrifier 119a plays the role of the additional electrification. The switching of the conditions of the preliminary electrifiers 119a and 119b accompanying the switching of the scanning direction of the wafer is done by the preliminary electrification controller 120 through the command of the inspection apparatus controller 117. In the case where a wafer to be inspected is likely to maintain an electrified state, it is possible to operate the preliminary electrifiers 119 intermittently during the inspection. The region, electrified with the preliminary electrifiers 119 is sufficiently larger than the region of inspection and thus it is possible to electrify a large area of region by scanning the wafer only once in the X direction. Therefore, it is possible to stop the operation of the preliminary electrifiers 119 in the successive scanning. The inspection apparatus controller 117: decides the timing of the turn-on and turn-off of the preliminary electrifiers 119 in accordance with the setting by a user; and instructs the preliminary electrification controller 120.

Figure 3:
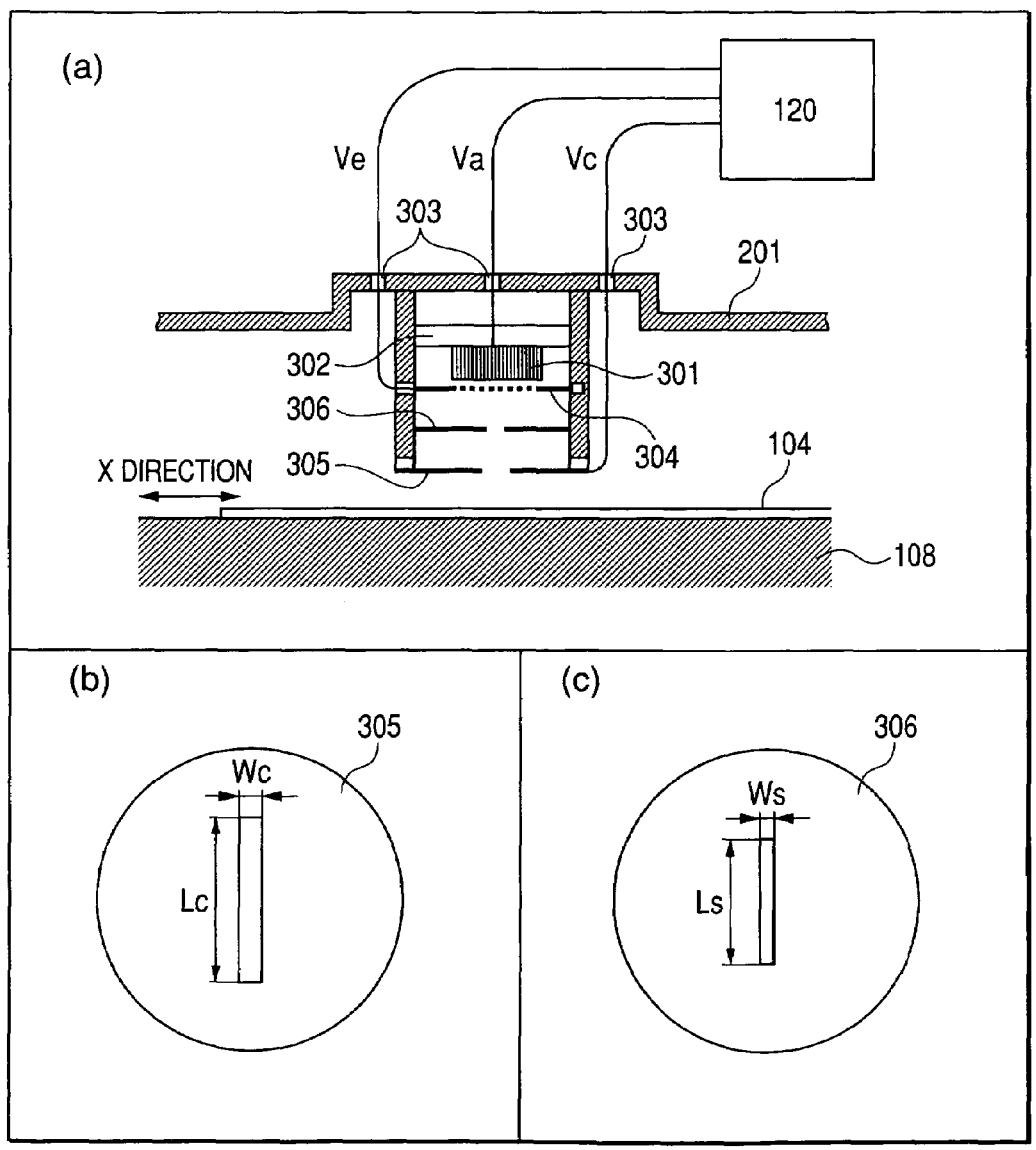
FIG. 3 explains the configuration of a preliminary electrifier.

The details of one of the preliminary electrifiers 119 are shown in FIG. 3. FIG. 3a shows a cross section of a preliminary electrifier. This is the case where the irradiation beam used for preliminary electrification is an electron beam. As the electron beam source, an areal electron source 301 represented by an electron source using carbon nanotubes (CNT) is used. The electron source 301 is disposed in the vacuum chamber 201 through an electrically insulated table 302 and a cable to apply the acceleration voltage Va of the electron beam is connected from the outside of the vacuum through an introduction terminal 303. A grid-shaped extraction electrode 304 is disposed while being insulated from the vacuum chamber 201 and a cable to apply the extraction voltage Ve is led to the outside of the vacuum through another introduction terminal 303. Although the electron source 301 and the extraction electrode 304 are attached to the vacuum chamber 201 independently from each other in the figure, they may be used as a structure formed by integrating them.

An electrification control electrode 305 to control the electrification of a wafer 104 is disposed so as to be as close to the wafer 104 as possible while being insulated from the vacuum chamber. In the case of such an areal electron source as a CNT electron source, the parallelism of a beam is good and hence, when a grid-shaped electrode is used, a portion which is shaded by the grid and shields the permeation of an electron beam reaches the wafer as it is, and a grid-shaped unevenness of irradiation beam strength is caused. The unevenness of the distribution in the X direction is equalized since the wafer moves in the X direction during inspection, but the unevenness in the direction (the Y direction) perpendicular to the moving direction is not equalized. In mirror electron imaging wherein uniformity of electrification potential is required, such unevenness of the irradiation electron beam strength induces abnormality of the contrast of an image and causes misinformation to be obtained. FIG. 3b shows a structure of the electrification control electrode 305. The electrification control electrode 305 has a structure formed by providing an electrically-conductive plate with an opening having the width Wc in the direction (the X direction) wherein the stage moves during inspection and the length Lc in the direction (the Y direction) perpendicular to the direction wherein the stage moves during inspection (the X direction). The length Lc is designed so as to be longer than the width Wc. A cable to apply the voltage Vc to the electrification control electrode 305 is led to the outside of the vacuum through another introduction terminal 303. The voltages applied to the electrodes and the like are supplied from the preliminary electrification controller 120 in accordance with the setting of a user.

Further in the present embodiment, a beam forming slit 306 is provided between the extraction electrode 304 and the electrification control electrode 305. FIG. 3c shows a structure of the beam forming slit 306. The beam forming slit 306 has a structure formed by providing an electrically-conductive plate with an opening having the width Ws and the length Ls, and maintains the relationship with the width Wc and the length Lc of the opening of the electrification control electrode 305 so as to satisfy the expressions Ws<Wc and Ls<Lc. The purpose of the installation of the beam forming slit 306 is to prevent electrons coming from the electron source 301 from colliding with the electrification control electrode 305. By the installation of the beam forming slit 306, it is possible to prevent the danger that secondary electrons generated by the exposure of the electrification control electrode 305 to an electron beam disturb the electrification potential formed on the wafer 104. Further, if a heating mechanism to prevent contamination caused by the electron beam irradiation to the beam forming slit 306 is provided, it is possible to prevent the abnormal deflection of an electron beam caused by the electrification of an adsorptive material and maintain uniform irradiation to a wafer.

By the means of the present embodiment, it is possible to always apply uniform electron beam irradiation to a wafer in preliminary electrification operation, and hence it is possible to form a uniform electrification potential and increase the accuracy of wafer inspection.

Embodiment 2

Figure 4:
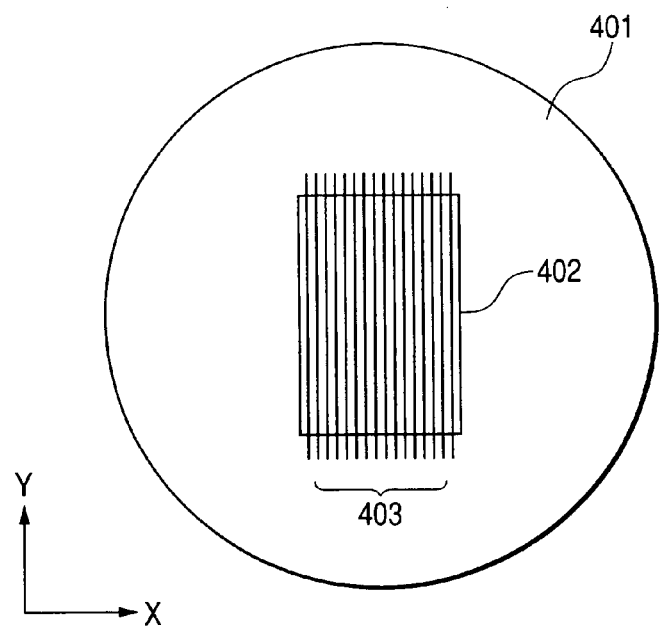
FIG. 4 explains an example of the extraction electrode of a preliminary electrifier.

In the present embodiment, an example of an extraction electrode having a structure other than that of a usually used grid electrode in a preliminary electrifier 119 in the apparatus configuration shown in FIG. 1 is explained. FIG. 4 shows a structure of the extraction electrode. The extraction electrode has a lattice structure formed by aligning extra-fine conductive wires 402 in parallel on an opening 401 through which an electron beam passes. The direction of the extension of the wires 402 is the direction (the Y direction) perpendicular to the direction of the movement of a wafer stage during inspection. By mounting the electrode of the present embodiment onto a preliminary electrifier shown in FIG. 1 or FIG. 3a, it is possible to apply electron beam irradiation which is uniform in the direction perpendicular to the direction of the wafer stage movement during inspection to a wafer from the stage of the extraction of the electron beam. As a result, it is possible to form an electrification potential having enhanced uniformity and further increase the accuracy of wafer inspection.

Embodiment 3

Figure 5:
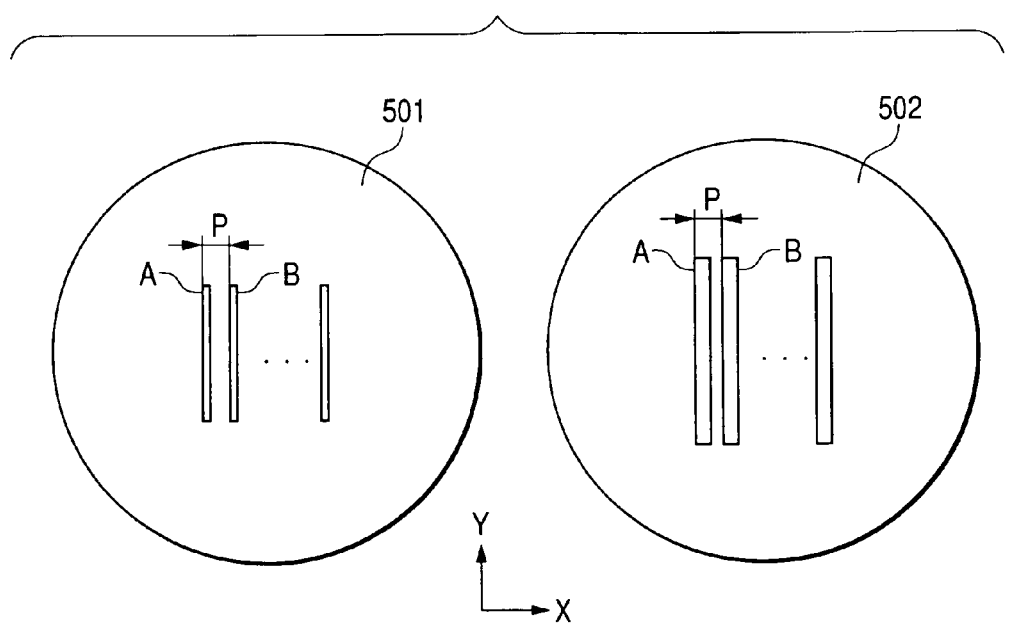
FIG. 5 explains examples of the extraction electrode and the beam forming slit of a preliminary electrifier.

There are some cases where a large amount of electric charge must be supplied to a wafer until a desired electrification potential is obtained in accordance with the type of a wafer to be inspected. Since the speed of the wafer stage cannot be changed in the preliminary electrification during inspection, in order to supply a larger amount of electric charge, it is necessary to take a means of either increasing the electric current from an electron source or expanding the irradiation area to the direction of the wafer stage movement. When electric current from an electron source is increased, disadvantages including the shortening of the service life of the electron source and the like tend to arise. To cope with the problem, in the present embodiment, adopted is a structure wherein, in such a preliminary electrifier as shown in FIG. 1 or FIG. 3a, an electrification control electrode 501 and a beam forming slit 502, those being provided with plural openings, are used and thus the irradiation area of a beam is expanded. FIG. 5 shows the structures of the electrification control electrode 501 and the beam forming slit 502. The intervals P (the distance P between the starting point A of an opening and the starting point B of the adjacent opening in the direction of the stage movement (the X direction)) of the openings of the electrification control electrode 501 are set to be equal to the intervals P of the openings of the beam forming slit 502, and thereby an electron beam can be adjusted by using the beam forming slit 502 so as to pass through only the inside of the openings of the electrification control electrode 501.

By applying the present embodiment to the apparatus shown in FIG. 1, it is possible to increase the amount of an electron beam supplied to a wafer while maintaining the uniformity of the electrification potential without imposing burdens on an electron source.

Embodiment 4

In the present embodiment, described is an example wherein the amount of electrons with which a wafer is irradiated is reduced gradually toward the outside in a preliminary electrifier 119 of an apparatus shown in FIG. 1 or FIG. 3a.

Figure 16:
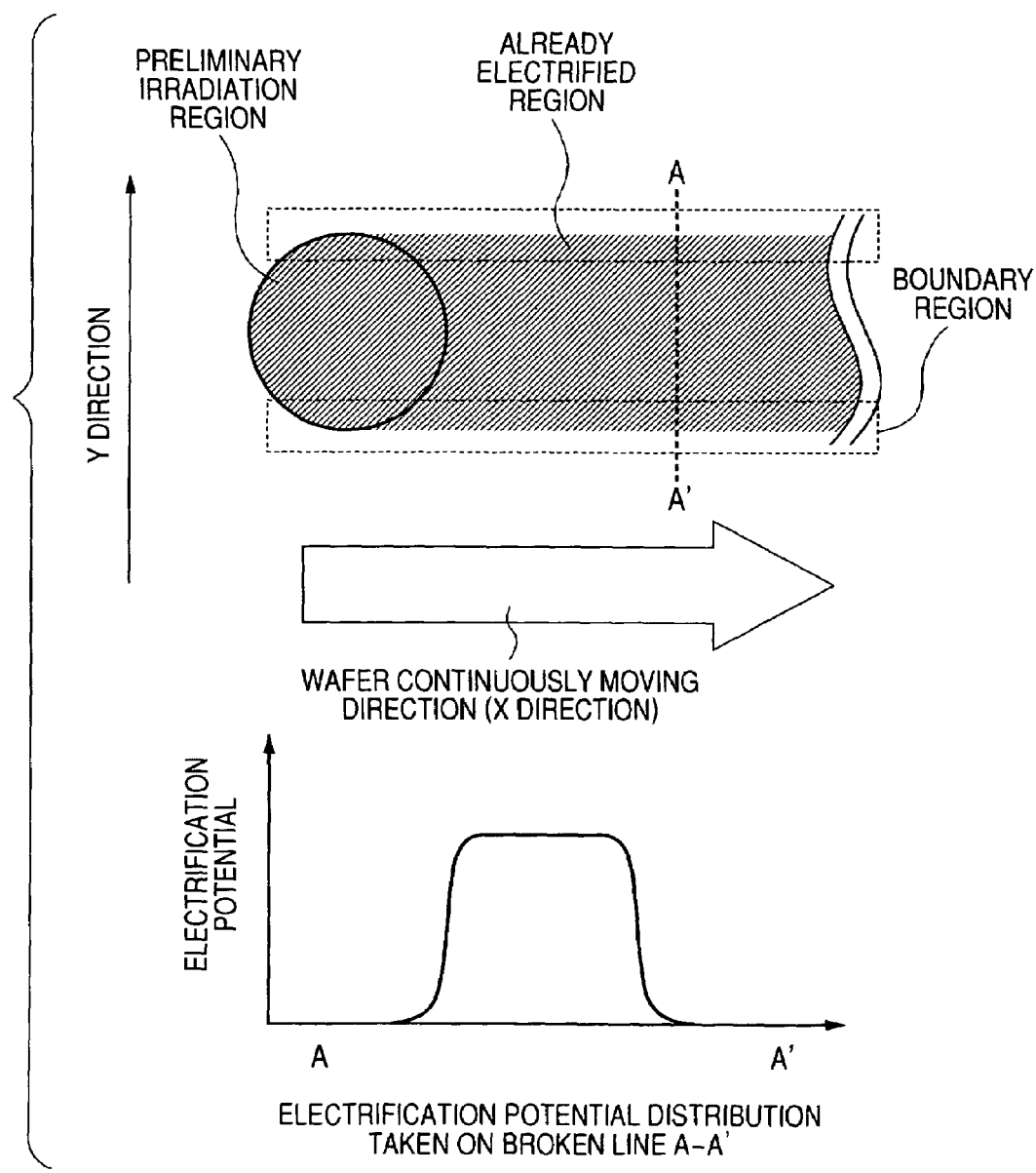
FIG. 16 explains problems arising with preliminary electrification.

Conventionally, a preliminary electrifier has been disposed in the vicinity of an electron optical column for imaging in a mirror electron imaging type inspection apparatus. A wafer to be inspected moves little by little in the Y direction while reciprocally moving in the X direction and the entire surface of the wafer is inspected. The region to which preliminary electrification is applied must be sufficiently larger than the field of view of inspection in order to prevent the boundary of the preliminary irradiation region from affecting the potential distribution in the field of view of mirror electron imaging, namely in order to form a uniform electrification potential in the inspection region. For example, whereas the size of the field of view in mirror electron imaging during inspection is 100 to 200 microns, the size of the region of the preliminary irradiation is about 10 mm, and thus the sizes are largely different from each other. As shown in FIG. 16, when a wafer moves continuously in the X direction, the region to which preliminary electrification is applied extends in the form of a strip on the surface of the wafer. A part to which preliminary irradiation is already applied is electrified to a prescribed potential and a part to which preliminary irradiation is not applied has a potential different from the part to which preliminary irradiation is already applied. In such a state, since the width of the strip is larger than the field of view of inspection, the boundary of the electrification region reaches an uninspected region which has yet to be inspected. Since a mirror electron imaging type inspection apparatus forms a potential distribution on a surface as an image, when the boundary of a preliminary electrification region having potential gradient is observed as it is with mirror electrons, the boundary forms a line and undesirably appears as an image. The linear contrast appearing in the mirror electron image strengthens as the steepness of the change of the electric charge distribution in the boundary region increases. For example, in the case of a wafer which is coated with a material wherein the time of diffusion of electrified charge is long, the steep change of a potential at the boundary of the region electrified by preliminary electrification is undesirably maintained. Although preliminary electrification is newly applied immediately before the pattern overlapping with the boundary region is inspected, it takes time until already generated difference in the amount of electrified charge is completely eliminated and it happens that an image is obtained while the line remains. In such a case, even when preliminary electrification is applied immediately before inspection, the boundary remaining as a result of the preliminary electrification applied in the previous inspection appears in a mirror electron image as contrast abnormality when the subsequent inspection image is obtained. A problem has been that, by such abnormal contrast in a mirror electron image caused by the unevenness of electrification potential, a portion which is not a defect is undesirably counted as a defect and correct inspection cannot be carried out in actual inspection.

Figure 6A:
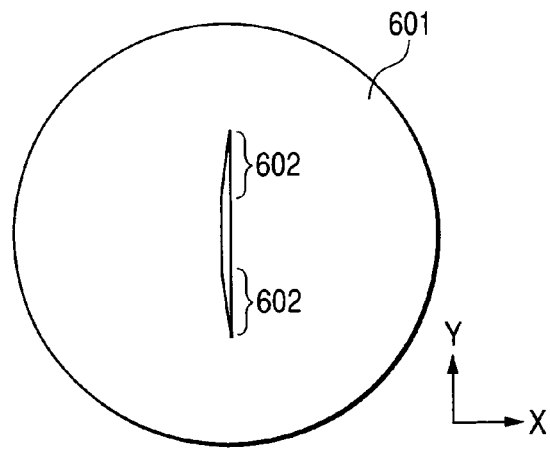
FIG. 6 explains examples of beam forming slits.
Figure 6B:
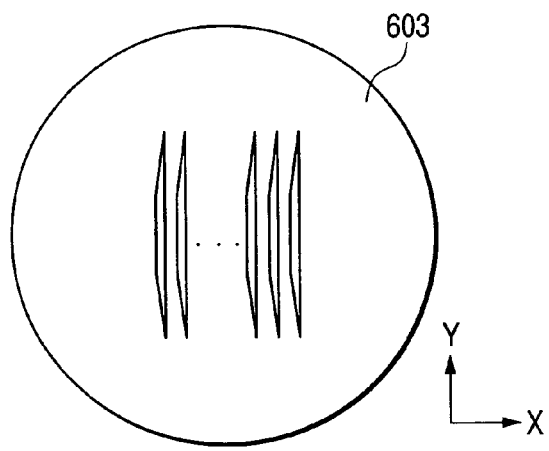
Figure 6C:
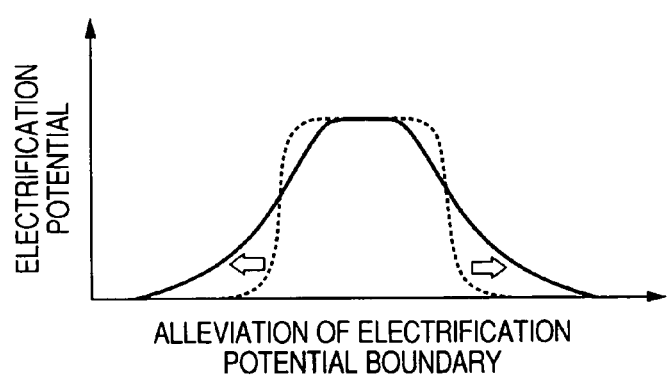

Then in the present embodiment, in a preliminary electrifier 119 of an apparatus shown in FIG. 1 or FIG. 3a, the opening of a beam forming slit 601 is provided with opening width changed portions 602 wherein the opening width narrows toward both the ends as shown in FIG. 6a. By forming the opening into such a shape, it is possible to: decrease the amount of electrons with which a wafer is irradiated gradually toward the outside; decrease the gradient of the electrification potential change at the electrification potential boundary as shown in FIG. 6c; and prevent contrast caused by a steep potential gradient from appearing. Further, a beam forming slit 603 shown in FIG. 6b is provided with aligned plural openings having a shape shown in FIG. 6a, and by using such a slit, it is possible to increase the amount of electric charge supplied to a wafer without generating a steep potential portion at the boundary. Here, in any of the cases, the electrification control electrode may be provided with a rectangular opening or rectangular openings as shown in FIG. 5.

Embodiment 5

Figure 7:
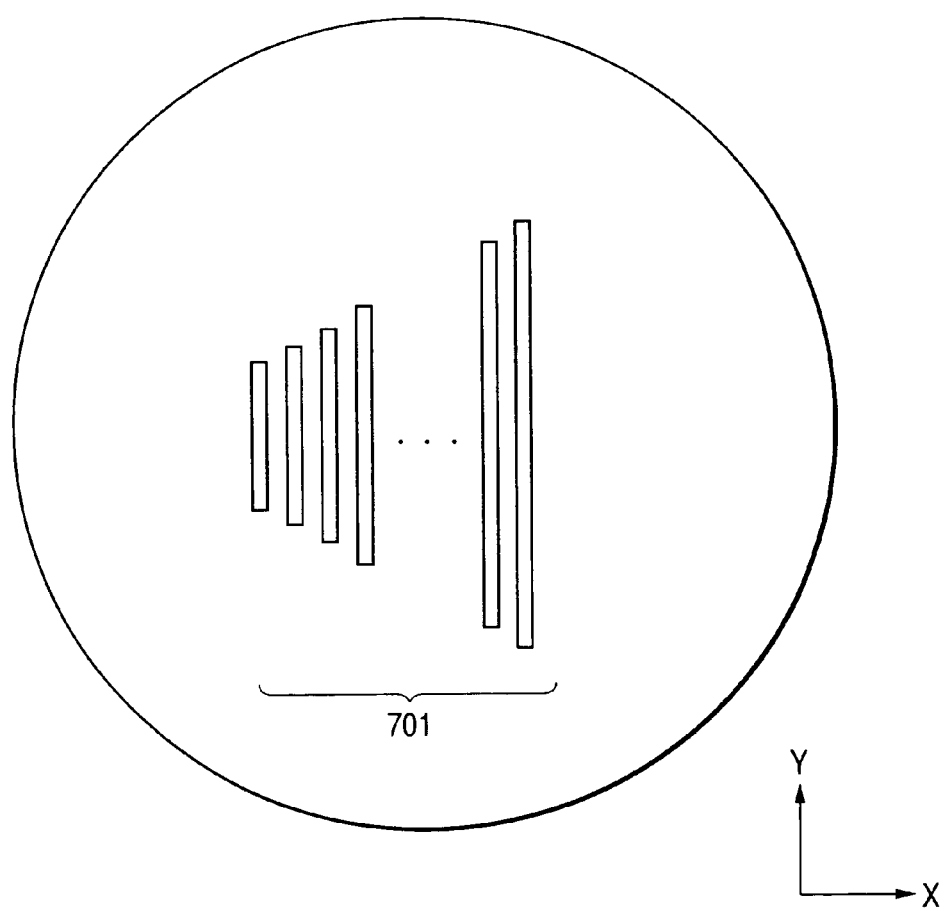
FIG. 7 explains another example of a beam forming slit.

In Embodiment 4, an opening of a beam forming slit is formed so as to narrow toward both the ends thereof. However, when plural openings are fabricated as shown in FIG. 6b, the fabrication process becomes complicate. To cope with that, in the present embodiment, the lengths of plural openings are changed little by little as shown in FIG. 7 in a preliminary electrifier 119 of the apparatus shown in FIG. 1 or FIG. 3a. By the means of the present embodiment, it is possible to: increase the amount of electric charge supplied to a wafer without generating a steep potential part at a boundary; and realize preliminary irradiation that does not cause steep potential change through easier fabrication process.

Embodiment 6

Figure 8:
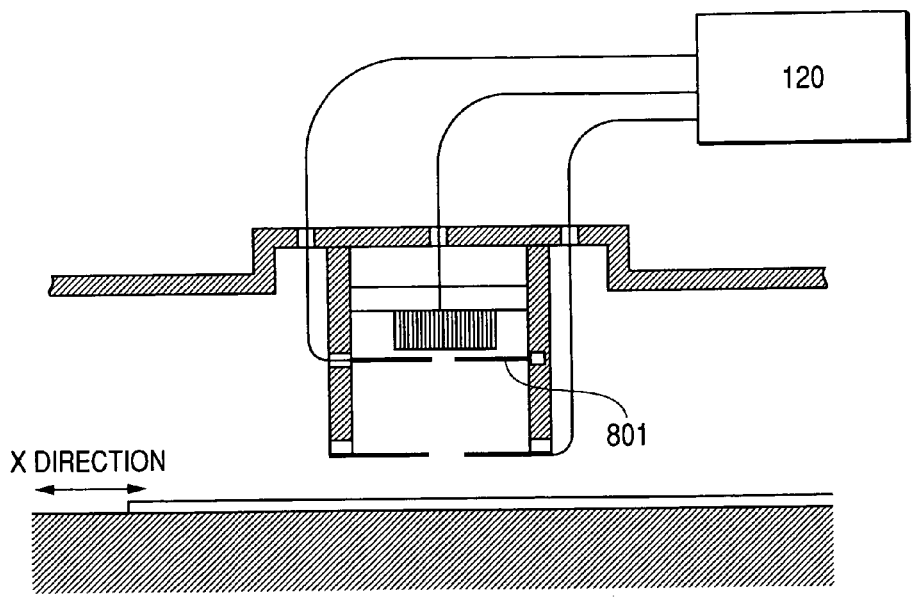
FIG. 8 explains an example of a preliminary electrifier.

In the examples explained above, an extraction electrode to extract preliminary irradiation electrons is provided. In the present embodiment, such a slit 701 as shown in FIG. 7 is disposed in the vicinity of an electron source instead of an extraction electrode, and thereby a beam forming slit and an extraction electrode are combined as shown in FIG. 8 in a preliminary electrifier 119 of the apparatus shown in FIG. 1. By adopting such arrangement, it is possible: not only to simplify the structure; but also to eliminate the unevenness of the irradiation electron distribution caused by the grid of an extraction electrode from the bottom up and further equalize the amount of an irradiation electron beam.

Embodiment 7

Figure 9:
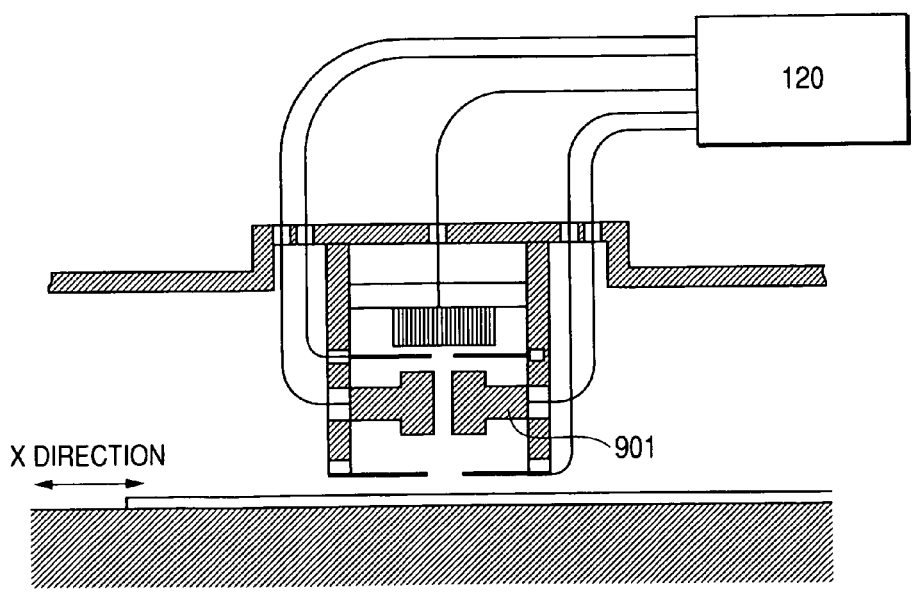
FIG. 9 explains another example of a preliminary electrifier.

In the present embodiment, a blanker 901 is disposed between a slit combined with an extraction electrode as shown in the invention of Embodiment 6 and an electrification control electrode as shown in FIG. 9 in a preliminary electrifier 119 of the apparatus shown in FIG. 1. The preliminary irradiation is applied during inspection. However, in the case of a wafer having sufficiently long electrification retention time, it is not necessary to apply the preliminary irradiation continuously during inspection and the preliminary irradiation may be stopped during pre-measured retention time. That is, the preliminary irradiation is applied intermittently at intervals of time during inspection. On this occasion, if the generation itself of an electron beam from an electron source is stopped, it sometimes happens that the state of a power source and the state of the electron source slightly change when a subsequent electron beam is generated and the same irradiation strength as generated before the stop is not reproduced. Further, repeated turn-on and turn-off of the electron source may cause the service life of the electron source itself to shorten. To cope with that, in the present embodiment, as a means of stopping irradiating a wafer with an electron beam without stopping generating electrons from an electron source, a blanker 901 is disposed. When the irradiation of an electron beam to a wafer is stopped, a predetermined voltage is applied to the blanker 901, the route of the electron beam is largely deflected, and thereby the electron beam is shielded with the sidewall of the blanker 901. The timing of the irradiation is controlled with the preliminary electrification controller 120. By the means of the present embodiment, it is possible to intermittently irradiate a wafer always with a constant amount of electron beam without deteriorating the service life of the electron source.

Embodiment 8

Figure 17:
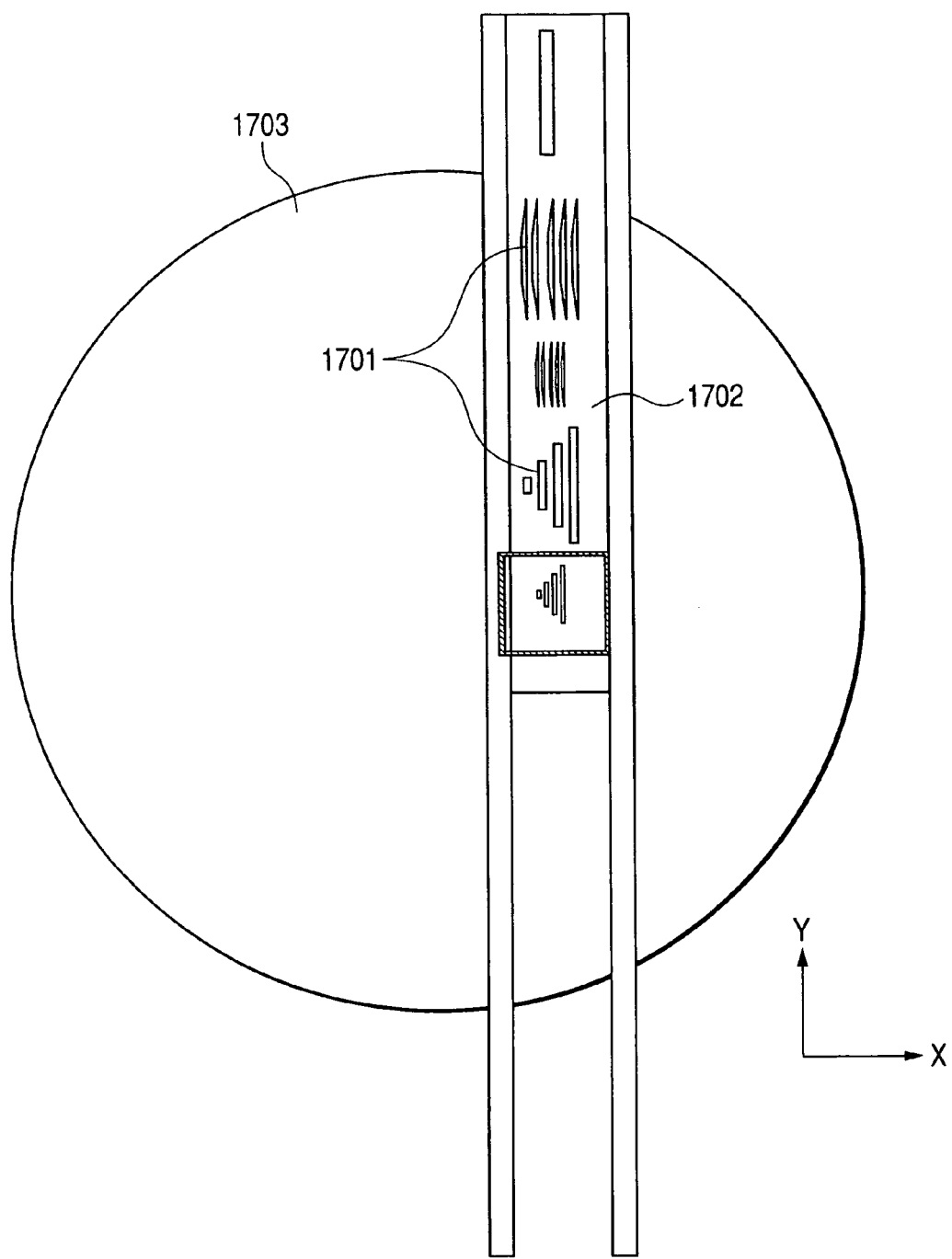
FIG. 17 explains an example of a beam forming slit.

In the present embodiment, as shown in FIG. 17, a movable plate 1072 having such plural prescribed openings 1701 as shown in aforementioned examples beforehand is used as a beam forming slit in a preliminary electrifier 119 of an apparatus shown in FIG. 1 or FIG. 3a. When only wafers 1703 which have an identical chip size and do not have large difference in time required for preliminary electrification are inspected, it is not necessary to frequently change the size of the openings. However, when a chip having a different size or a wafer which requires longer time for preliminary electrification is successively inspected, openings suitable for the new wafer are selected, the openings are moved to intended places, and the inspection is carried out. It is possible to adopt a method of moving a wafer little by little in the Y direction while reciprocally moving the wafer in the X direction so as to be able to inspect the entire wafer during inspection. With regard to the movement in the Y direction however, it is also possible to move the movable plate 1702 with a drive unit in synchronization with the movement of a wafer 1703 under inspection. This kind of control is carried out with the preliminary electrification controller 120. By adopting such a configuration, it is possible to: change the size of an irradiation region merely by selecting openings prepared in a movable plate; and thus increase the inspection speed.

Embodiment 9

Figure 10:
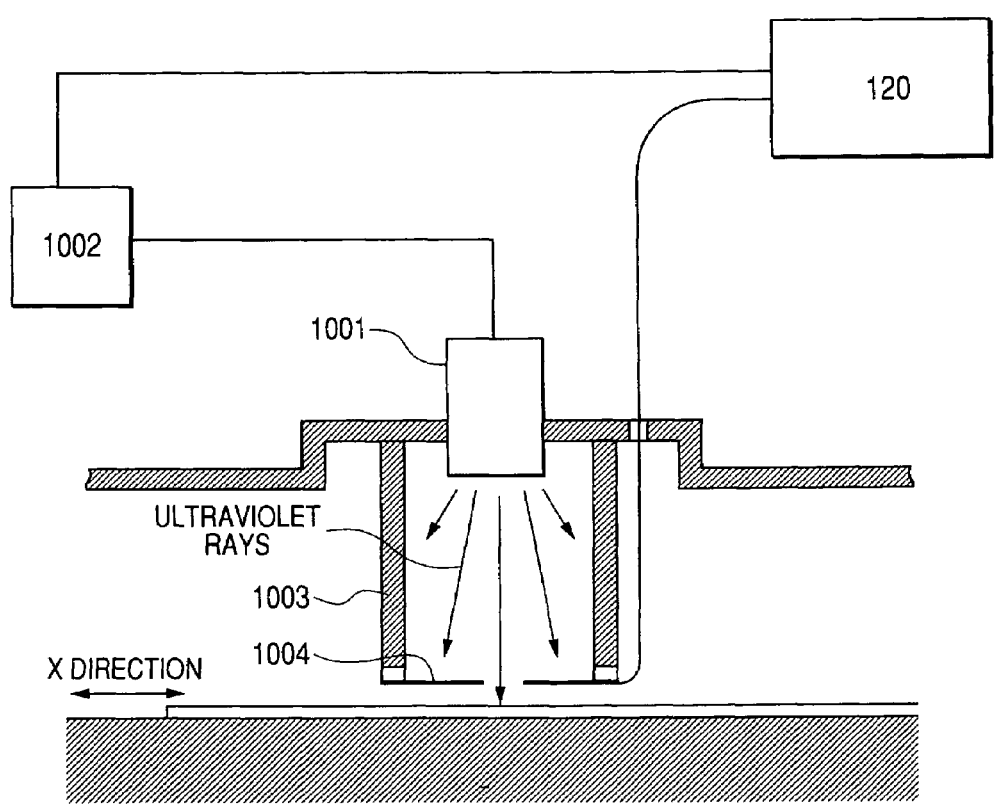
FIG. 10 explains another example of a preliminary electrifier.

The above examples have been based on the premise that an electron beam is used as the irradiation beam for preliminary electrification. It is possible to control the electrification of a wafer also by the irradiation of ultraviolet rays in the same way as the electron beam irradiation. FIG. 10 shows the case where ultraviolet rays are used as an irradiation beam source other than an electron source in a preliminary electrifier 119 of such an apparatus as shown in FIG. 1. An ultraviolet light source 1001 generates ultraviolet rays having a sufficient energy to excite photoelectrons of a wafer. The ultraviolet light source 1001 is controlled with a controller 1002, and the controller carries out the setting of the ultraviolet light strength and the irradiation time, turn-on and turn-off of the ultraviolet light, and others in accordance with instructions of the preliminary electrification controller 120. Such ultraviolet rays are generally vacuum ultraviolet rays that do not permeate the air and hence the light source is placed in a vacuum chamber. An outer casing 1003 to shield the part not requiring ultraviolet light from irradiation is disposed and an electrification control slit 1004 is disposed at the tip thereof protruding toward the side of a wafer. By the means of the present embodiment, it is possible to electrify a wafer with ultraviolet rays which are more stable than an electron beam.

Embodiment 10

Figure 11:
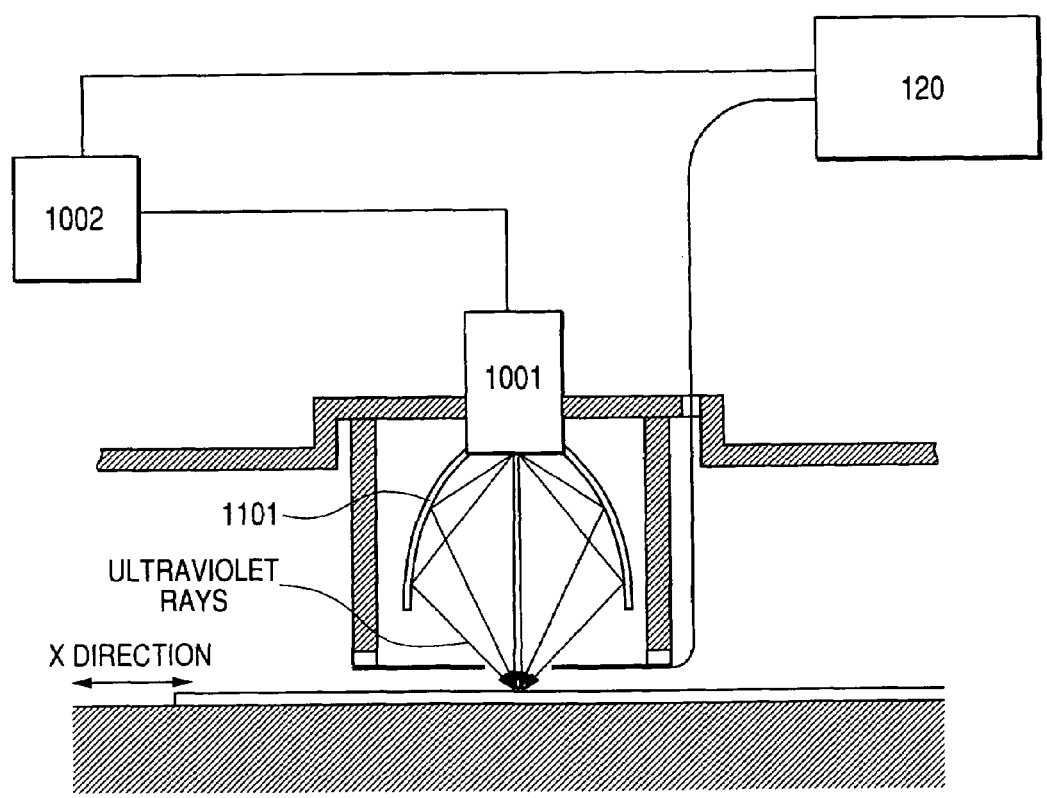
FIG. 11 explains another example of a preliminary electrifier.

In the case of Embodiment 9, ultraviolet rays diffuse from an ultraviolet light source, the amount of the ultraviolet rays which can actually contribute to electrification is small, and there is a possibility that electric charge necessary for the desired electrification of some wafers cannot be generated. To cope with the problem, in the present embodiment, a reflex mirror 1101 is disposed on an ultraviolet light source so that the diffused ultraviolet rays may be condensed and may reach a wafer as shown in FIG. 11. By applying the means of the present embodiment to such an apparatus shown in FIG. 1, it is possible to: efficiently irradiate a wafer with ultraviolet light; and electrify a wafer at a shorter period of time.

Embodiment 11

In the above examples, the cases where wafers are electrified simultaneously during inspection to detect electrical defects have mainly been explained. In those cases however, since the beam irradiation time is restricted by the traveling speed of a wafer, the setting of a long beam irradiation time is also restricted. Further, in some semiconductor manufacturing processes, an electrification distribution having a large potential is caused on the whole wafer. Such a large electrification potential cannot be eliminated with the preliminary irradiation applied simultaneously with the inspection which allows only a limited irradiation time and there is a possibility that large contrast abnormality arises in a mirror electron image.

Figure 12:
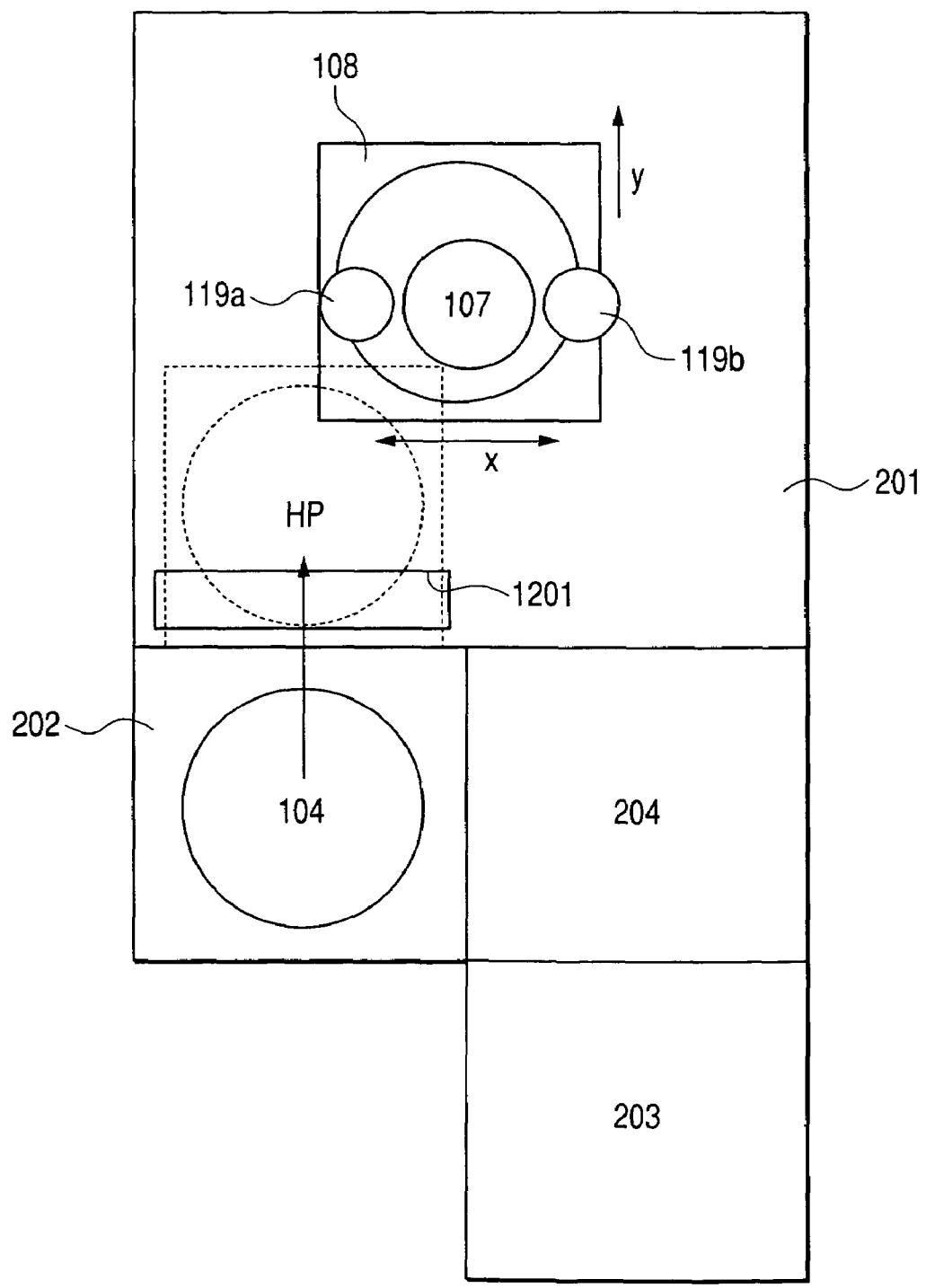
FIG. 12 explains an example of a mirror electron imaging type inspection apparatus using a preliminary static eliminator.

To cope with the problem, in the present embodiment, when a wafer is transferred from a preliminary chamber 202 to a vacuum chamber 201, the already existing electrification of the wafer is eliminated or reduced to a potential level controllable by preliminary electrification applied at inspection with a preliminary static eliminator 1201 as shown in FIG. 12. A desirable place where the preliminary static eliminator 1201 is installed is on the side of the vacuum chamber 201 at the opening between the preliminary chamber 202 and the vacuum chamber 201. By adopting such arrangement, it is possible to eliminate electrification by preliminary electrification during the transportation of a wafer and hence the inspection time is not substantially disturbed.

Figure 13:
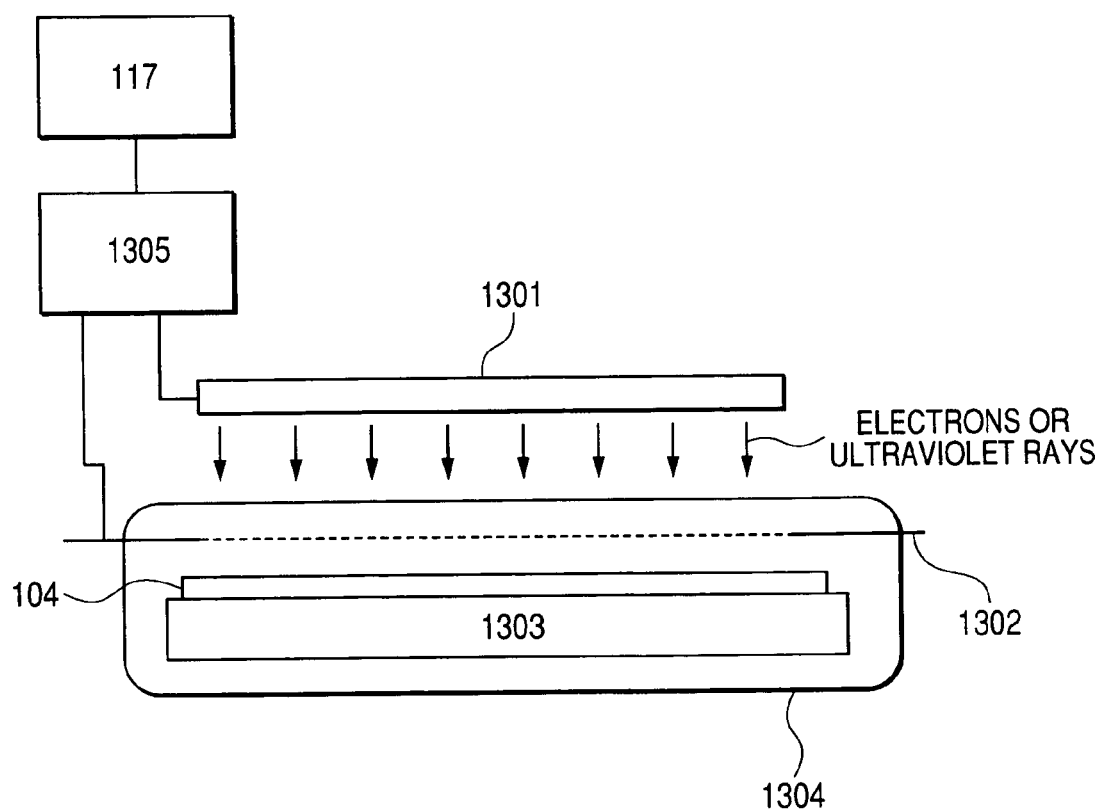
FIG. 13 explains an example of a preliminary static eliminator.

The basic configuration of a preliminary static eliminator 1201 is shown in FIG. 13. FIG. 13 is a view taken by viewing a wafer charging port 1304 on the side of a preliminary chamber from the main chamber of an apparatus and a wafer 104 is placed on a transfer table 1303 and moves from the rear side of the figure to the front side thereof. An electron source 1301 which is longer than the diameter of the wafer is used in order to uniformly irradiate the entire surface of the wafer with an electron beam. The electron source 1301 comprises carbon nanotubes built on a rectangular substrate for example, and, though it is not shown in the figure, an extraction electrode of a grid-shape is disposed in the vicinity in order to extract electrons from the carbon nanotubes and an electron beam of a rectangular cross section can be generated. An electrification control electrode 1302 is disposed right above the wafer. The electrification control electrode comprises a rectangular opening and a mesh and forms a potential of nearly zero volt immediately above the wafer. Unlike the preliminary electrifiers of the previous examples, it is not necessary to form a uniform electrification distribution immediately before inspection, it is only necessary to control the potential of a wafer to the extent of allowing being recreated by preliminary electrification during inspection, and hence a mesh electrode is used for the electrification control electrode. Details such as structures to support members, cables to supply power source to electrodes, and others are omitted here. The voltages applied to the electron source and the electrodes are controlled and supplied with a preliminary static elimination controller 1305 which is controlled with an inspection apparatus controller 117.

Figure 14:
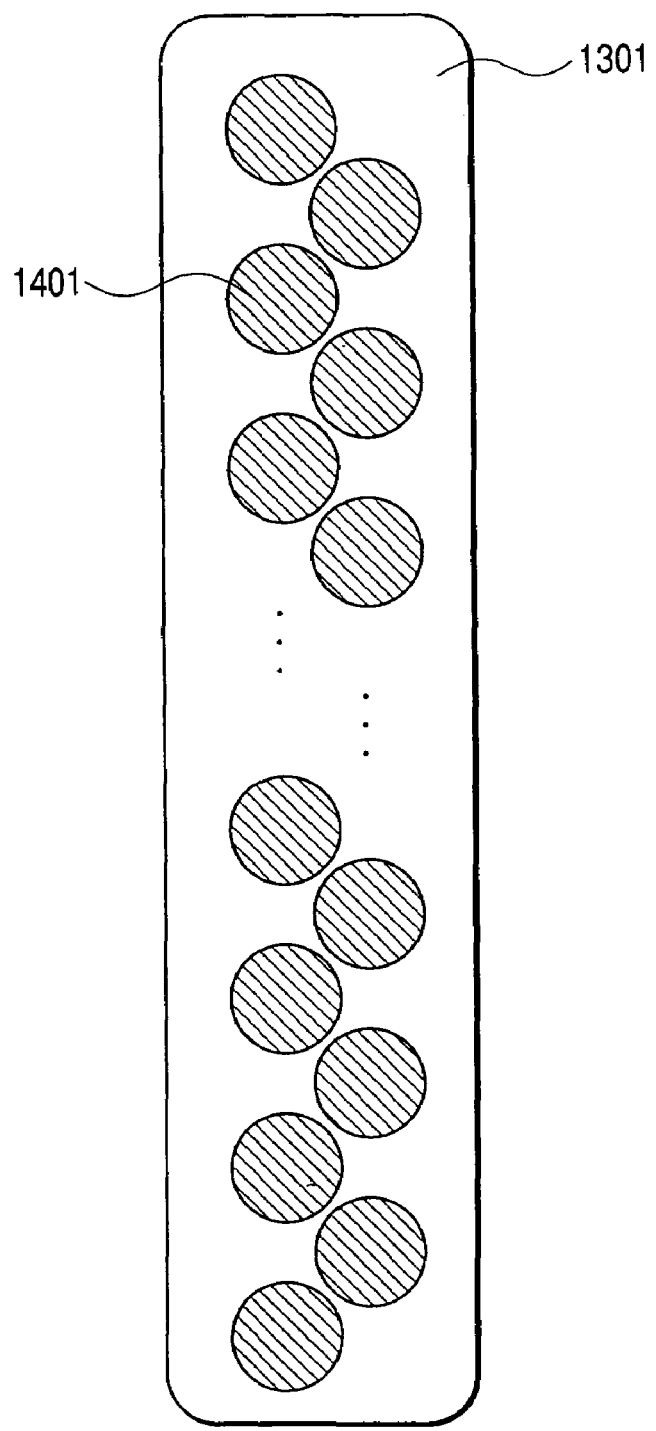
FIG. 14 explains another example of a preliminary static eliminator.

Besides such a rectangular electron source of a large size as described in the above example, it is possible to configure an electron source of a preliminary static eliminator 1201 by using such an electron source as used in a preliminary electrifier 119. As shown in FIG. 14, plural electron sources 1401 each of which is provided with an extraction electrode are disposed in the form of staggered rows comprising at least two rows so that the irradiation regions may overlap with each other. When a sufficient amount of electron beam irradiation is required, the number of the parallel electron source rows is increased appropriately. In this case, besides the electron sources 1401, vacuum ultraviolet light sources aligned in plurality may also be used.

Figure 15:
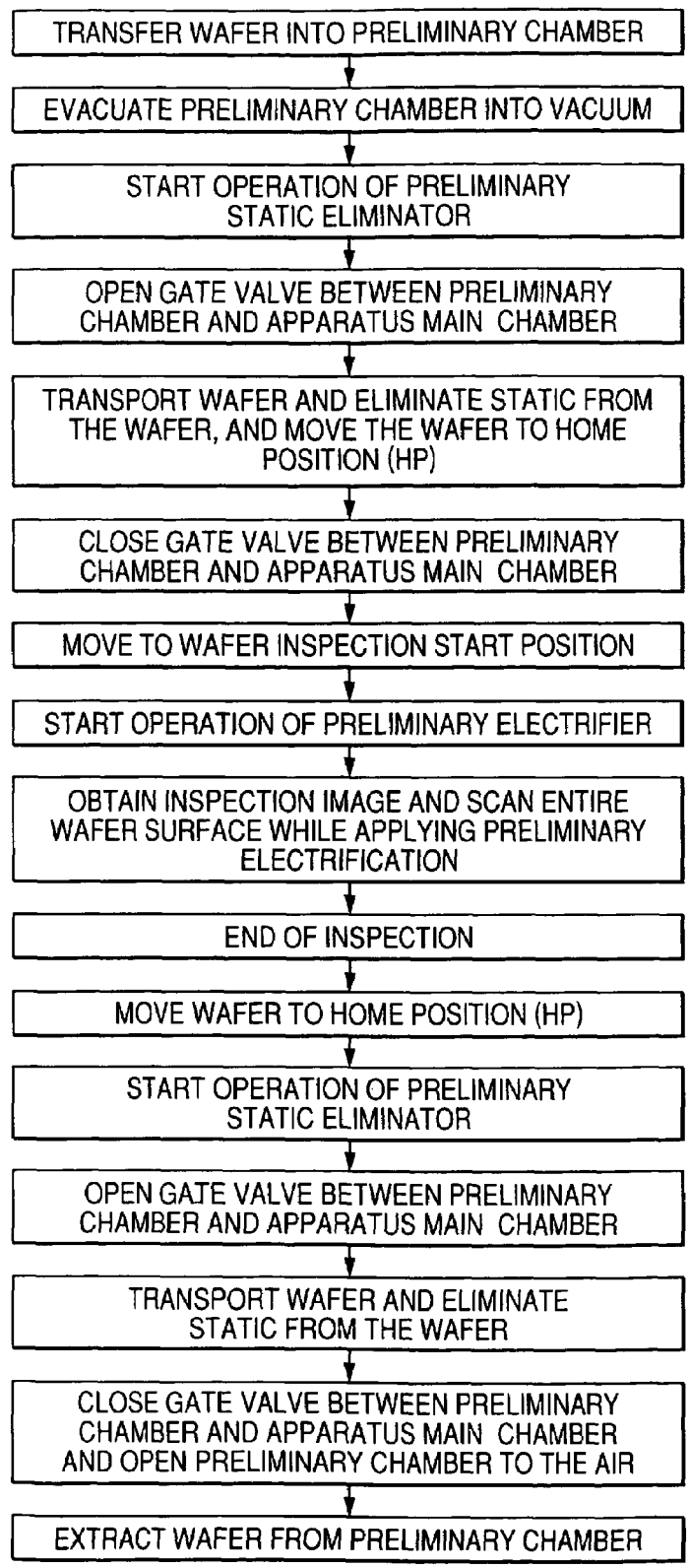
FIG. 15 explains an example of inspection operation of a mirror electron imaging type inspection apparatus using a preliminary static eliminator.

FIG. 15 shows the major parts of a flow of wafer inspection to which the means of the present embodiment is applied. Though not shown in the figure, it is assumed that various conditions of each operation are transferred from an inspection apparatus controller to each controller beforehand or properly. When a wafer is introduced from a wafer transfer robot in the state where a preliminary chamber is open to the air, a wafer charging port of the preliminary chamber is sealed and the air is evacuated. At the same time, the operation of preliminary static elimination is started to prepare for the static elimination during the transportation of the wafer. When the degree of vacuum in the preliminary chamber comes to a sufficiently low level, a gate valve between the preliminary chamber and an inspection apparatus main chamber opens and the transportation of the wafer is started. The traveling speed during the wafer transportation is properly adjusted so as to secure sufficient static elimination. When the wafer is completely transferred into the apparatus main chamber, the beam of the preliminary static eliminator is stopped or the wafer is shielded from the beam, the beam irradiation is finished, and simultaneously the gate valve is closed. The wafer waits for the commencement of inspection at a home position (HP) and successively moves to a position where next inspection starts. Thereafter, the operation of the preliminary electrifier starts, and inspection is commenced on condition that a sufficient and stable irradiation beam strength and voltage conditions conforming to the recipe are obtained. When the inspection of the wafer under preliminary electrification is finished, the preliminary electrifier stops the beam or shields the wafer from the beam, and the wafer is returned to the home position (HP) again. When the wafer is not reinspected, the preliminary static eliminator restarts the operation toward the conditions allowing the beam irradiation of a wafer. At this moment, the electrode conditions are set so that the potential of the wafer may be zero volt. When the degree of vacuum in the preliminary chamber is sufficiently low, the gate valve between the apparatus main chamber and the preliminary chamber opens and the static elimination operation and transportation of a wafer are carried out. After the wafer is completely transferred into the preliminary chamber, the beam of the preliminary static eliminator stops or the wafer is shielded. The gate valve between the apparatus main chamber and the preliminary chamber is closed, the preliminary chamber is open and released to the air, and thereafter the wafer is extracted from the preliminary chamber with the transfer robot and returns to the wafer charging port. At this stage, the potential of the electrification of the wafer is uniform and nearly zero volt, and the next process is not influenced at all.

By the means of the present embodiment, even when unintended electrification caused by various processes is formed on a wafer beforehand, it is possible not only to carry out stable and accurate inspection but also to remove the influence of the electrification on the next processes.

The examples according to the present invention have been described above. The combinations of those examples are also included in the present invention.

The present invention includes a defect inspection method which uses a defect inspection apparatus: to obtain an image of a circuit pattern formed on a specimen by areally irradiating a first region of a specimen introduced from an entrance with a first electron beam, reflecting the first electron beam immediately before falling on the specimen, and focusing the reflected electrons into an image; and to detect defects existing in the circuit pattern on the basis of the obtained circuit pattern image, wherein the method comprises the processes of: equalizing the electrification distribution in the first region by irradiating a second region including the first region on the specimen surface with ultraviolet rays or a second electron beam before the first region is inspected; and irradiating the specimen surface with a third electron beam or ultraviolet rays in the vicinity of the entrance.

The present invention further includes a defect inspection method wherein, in the aforementioned defect inspection method, the region irradiated with the third electron beam or the ultraviolet rays is longer than the diameter of the specimen.

The present invention further includes a defect inspection method wherein, in either of the aforementioned defect inspection methods, plural electron sources or plural ultraviolet light sources are used for the irradiation with the third electron beam.

The present invention further includes an inspection apparatus: to obtain an image of a circuit pattern formed on a specimen by areally irradiating a first region of the specimen with a first electron beam nearly in parallel, reflecting the first electron beam immediately before falling on the specimen, and focusing the reflected electrons into an image; and to detect defects existing in the circuit pattern on the basis of the obtained circuit pattern image, wherein: the inspection apparatus is provided with the means of irradiating a second region including the first region on the specimen with ultraviolet rays or a second electron beam before the circuit pattern image is obtained; and the deviation of each electrification potential in the electrification potential distribution in the first region from the average value of the electrification potentials on the entire surface of the specimen is 1 V or less.

The present invention further includes an inspection apparatus which is provided with: an electron optical system to irradiate a first region of a specimen introduced from an entrance with an electron beam; a specimen stage to retain the specimen; a means of applying such a voltage that the electron beam with which the specimen is irradiated does not enter the specimen but is reflected to the specimen stage or the specimen; a means of detecting the electrons reflected from the side of the specimen by the application of the voltage; a means of forming an inspection image and detecting a defect of the specimen on the basis of the detection signals of the detecting means; a means of irradiating the first region with ultraviolet rays or a second electron beam before the inspection image is formed; and a means of irradiating the specimen with a third electron beam or vacuum ultraviolet rays in the vicinity of the entrance.

The present invention further includes an inspection apparatus wherein, in the aforementioned inspection apparatus, the means of the irradiation with the third electron beam is provided with plural electron sources aligned in parallel.

What is claimed is:

1. A defect inspection method comprising:
   areally irradiating a first region of a specimen with a first electron beam;
   applying such a negative potential that said first electron beam is reflected immediately before entering said first region of said specimen; and
   focusing the reflected electrons into an image and inspecting a defect of said specimen,
   wherein said defect inspection method further comprising a process of equalizing the electrification distribution of said first region by irradiating a second region including said first region of said specimen with ultraviolet rays or a second electron beam before said first region is inspected.

2. A defect inspection method comprising:
   obtaining an image of a circuit pattern formed on a specimen by areally irradiating said specimen with a first electron beam, reflecting said first electron beam immediately before entering said specimen, and focusing the reflected electrons into an image; and
   inspecting and detecting a defect existing in said circuit pattern on the basis of the circuit pattern image,
   wherein the electrification potential distribution of said specimen generated by irradiating the surface of said specimen with ultraviolet rays or a second electron beam before obtaining said circuit pattern image is uniform.

3. A defect inspection method according to claim 1, wherein the uniformity of the electrification potential of said specimen is such that the deviation of the electrification potential at each part of said specimen from the average value of the electrification potentials on the entire surface of said specimen is 1 V or less.

4. A defect inspection method according to claim 1, wherein said specimen is intermittently irradiated with said second electron beam.

5. An inspection apparatus comprising:
- an electron optical system to irradiate a first region of a specimen with an electron beam;
- a specimen stage to retain said specimen;
- a means of applying such a voltage that said electron beam with which said specimen is irradiated does not enter said specimen but is reflected to said specimen stage or said specimen;
- a means of detecting the electrons reflected from the side of said specimen by the application of said voltage;
- a means of forming an inspection image and detecting a defect of said specimen on the basis of the detection signals of said detecting means; and
- a means of irradiating said first region with ultraviolet rays or a second electron beam before said inspection image is formed.

6. An inspection apparatus according to claim 5, wherein the uniformity of the electrification potential of said first region is such that the deviation of the electrification potential at each part of said specimen from the average value of the electrification potentials on the entire surface of said specimen is 1 V or less.

7. An inspection apparatus according to claim 5, wherein said inspection apparatus is provided with a means of continuously moving said specimen stage.

8. An inspection apparatus according to claim 5, wherein said means of emitting said ultraviolet rays or said second electron beam is a preliminary electrifier equipped with at least an ultraviolet light source or an electron source.

9. An inspection apparatus according to claim 5, wherein said inspection apparatus has a means of continuously moving said specimen.

10. An inspection apparatus according to claim 5, wherein: said inspection apparatus comprises an electrification control electrode to control secondary electrons generated from said specimen by being irradiated with said second electron beam or vacuum ultraviolet rays; and said electrification control electrode has an opening through which said second electron beam passes or said ultraviolet rays pass.

11. An inspection apparatus according to claim 10, wherein said opening has a shape the length of which in the direction perpendicular to the continuously moving direction of said specimen is longer than the length of said shape in the direction parallel with the continuously moving direction of said specimen.

12. An inspection apparatus according to claim 5, wherein said inspection apparatus has a beam forming slit between said electrification control electrode and the electron source of said second electron beam so that said electrification control electrode may not be irradiated with said second electron beam.

13. An inspection apparatus according to claim 10, wherein plural conductive wires are attached to the opening of said electrification control electrode so as to extend in the direction perpendicular to the continuously moving direction of said specimen.

14. An inspection apparatus according to claim 10, wherein said electrification control electrode has plural openings.

15. An inspection apparatus according to claim 12, wherein said beam forming slit comprises plural slits.

16. An inspection apparatus according to claim 10, wherein the shape of the opening of said electrification control electrode is configured so as to have the regions where the width of said opening gradually narrows toward both the ends of said opening so that the strength of said second electron beam with which said specimen is irradiated may gradually decrease toward both the ends of said opening.

17. An inspection apparatus according to claim 14, wherein the lengths of the sides of said plural openings are changed from each other.

18. An inspection apparatus according to claim 8, wherein said preliminary electrifier has an extraction electrode of said second electron beam and said extraction electrode is provided with a slit to form a beam.

19. An inspection apparatus according to claim 8, wherein said preliminary electrifier has a blanker.

20. A defect inspection method according to claim 2, wherein the uniformity of the electrification potential of said specimen is such that the deviation of the electrification potential at each part of said specimen from the average value of the electrification potentials on the entire surface of said specimen is 1 V or less.

21. A defect inspection method according to claim 2, wherein said specimen is intermittently irradiated with said second electron beam.

22. A defect inspection method according to claim 3, wherein said specimen is intermittently irradiated with said second electron beam.

23. A defect inspection method according to claim 20, wherein said specimen is intermittently irradiated with said second electron beam.

* * * * *